United States Patent [19]

Reymond et al.

[11] Patent Number: 5,256,073

[45] Date of Patent: * Oct. 26, 1993

[54] ELECTRICAL CONNECTORS FOR DIRECT CONNECTION TO PLATED THROUGH HOLES IN CIRCUIT BOARD

[75] Inventors: Welles K. Reymond, Waterbury, Conn.; Gregory L. Sorrentino, Brewster, N.Y.

[73] Assignee: General DataComm, Inc., Middlebury, Conn.

[*] Notice: The portion of the term of this patent subsequent to Oct. 30, 2007 has been disclaimed.

[21] Appl. No.: 892,684

[22] Filed: May 27, 1992

Related U.S. Application Data

[63] Continuation of Ser. No. 605,521, Oct. 29, 1990, abandoned, which is a continuation of Ser. No. 366,546, Jun. 13, 1989, Pat. No. 4,966,556.

[51] Int. Cl.⁵ .......................................... H01R 23/70
[52] U.S. Cl. .................................................... 439/79
[58] Field of Search .................. 439/55, 65, 67, 74, 439/75, 78, 79, 80, 81, 38, 39, 364, 381, 700, 131; 324/158 F, 158 P; 29/876, 882, 884

[56] References Cited

U.S. PATENT DOCUMENTS

| | | | |
|---|---|---|---|
| 3,144,527 | 8/1964 | Tolegian | 200/51.09 |
| 3,215,968 | 11/1965 | Herrmann | 339/17 |
| 3,290,636 | 12/1966 | Overtveld | 439/66 |
| 3,404,362 | 10/1968 | Amendola | 339/17 |
| 3,407,378 | 10/1968 | Siders | 339/176 |
| 3,430,182 | 2/1969 | Blanche | 339/17 |
| 3,447,249 | 6/1969 | Greger | 35/19 |
| 3,504,328 | 3/1970 | Olsson | 339/17 |
| 3,550,062 | 12/1970 | Drenten | 339/17 |
| 3,601,762 | 8/1971 | Eshelman | 339/64 M |
| 3,783,433 | 1/1974 | Kurtz | 339/17 C |
| 3,810,258 | 5/1974 | Mathauser | 339/12 R |
| 3,885,215 | 5/1975 | Weinstock | 324/158 P |
| 3,899,231 | 8/1975 | Bray | 361/408 |
| 3,996,516 | 12/1976 | Luther | 324/158 F |

(List continued on next page.)

FOREIGN PATENT DOCUMENTS

| | | |
|---|---|---|
| 2845632 | 3/1979 | Fed. Rep. of Germany . |
| 3441480 | 5/1986 | Fed. Rep. of Germany . |
| 3500227 | 7/1986 | Fed. Rep. of Germany . |

OTHER PUBLICATIONS

IBM Bulletin, Schick, vol. 6, No. 10, p. 5, Mar. 1964.
IBM Bulletin, Faure, vol. 17, No. 2, p. 444, Jul. 1974.
IBM Bulletin, Faure vol. 17, No. 5, Controlled Direction Buckling Beam, Oct. 1974.

*Primary Examiner*—Neil Abrams
*Attorney, Agent, or Firm*—David P. Gordon

[57] ABSTRACT

A pluggable electrical connector is provided having contact elements with first ends soldered to a daughter board, mid-sections which are crimped and bent through ninety degrees, and second ends which have a converging portion and which terminate in bifurcated conical contact portions which make contact with the rims of contact-quality plated through holes of a mother board. By causing contact between the rim and the cone surface, normal forces greater than the mating force are generated. The connector housing includes self-centering funnel openings adjacent the mother board for centering the converging portions of the contact elements therein in a nominal position and for acting as a preloading stop. The housing also includes side-wall locking tabs which hold adjacent rows of contacts at identical fixing points relative to the ninety-degree bend to ensure identical spring parameters for all contact elements. By arranging the housing properly, the contact elements can be manufactured into preloaded spring contacts during assembly by bending and locking the first ends of the contacts past the side-wall locking tabs. Cams or retracting bars can be used with rows or individual contacts to create a ZIF connector and/or a selectively engaged pin enabled connector. Magnets, spring-loaded jack screws, or the like are used in conjunction with the connector to establish and maintain force during mating.

33 Claims, 12 Drawing Sheets

U.S. PATENT DOCUMENTS

| | | | |
|---|---|---|---|
| 4,004,298 | 1/1977 | Freed | 3/1 |
| 4,012,093 | 3/1977 | Crane | 339/17 F |
| 4,042,880 | 8/1977 | Weinstock | 324/64 |
| 4,050,769 | 9/1977 | Ammon | 339/196 M |
| 4,095,867 | 6/1978 | Parks | 439/329 |
| 4,118,090 | 10/1978 | Del Mei | 339/12 R |
| 4,164,704 | 8/1979 | Kato | 324/73 PC |
| 4,175,810 | 11/1979 | Holt | 339/17 C |
| 4,242,657 | 12/1980 | Chaillot | 335/207 |
| 4,245,189 | 1/1981 | Wahl | 324/65 P |
| 4,270,826 | 6/1981 | Narozny | 339/75 MP |
| 4,321,532 | 3/1982 | Luna | 324/73 PC |
| 4,381,134 | 4/1983 | Anselmo | 339/220 R |
| 4,428,640 | 1/1984 | Pittman | 339/176 M |
| 4,443,756 | 4/1984 | Lightbody | 324/73 PC |
| 4,448,466 | 5/1984 | Porter | 339/17 M |
| 4,479,685 | 10/1984 | Kirby | 339/12 R |
| 4,498,722 | 2/1985 | Fedder | 339/75 MP |
| 4,504,101 | 3/1985 | Reimer | 339/17 L |
| 4,510,553 | 4/1985 | Faultersack | 361/413 |
| 4,526,429 | 7/1985 | Kirkman | 339/17 C |
| 4,528,500 | 7/1985 | Lightbody | 324/73 PC |
| 4,533,203 | 8/1985 | Feldman | 339/176 M |
| 4,541,678 | 9/1985 | Lumpp | 339/75 MP |
| 4,548,452 | 10/1985 | Gillett | 339/17 R |
| 4,550,962 | 11/1985 | Czeschka | 339/17 LC |
| 4,571,542 | 2/1986 | Arai | 324/158 P |
| 4,587,596 | 5/1986 | Bunnell | 361/398 |
| 4,606,589 | 8/1986 | Elsbree, Jr. | 339/17 C |
| 4,652,066 | 3/1987 | Pelzl | 339/17 LC |
| 4,675,600 | 6/1987 | Gergin | 324/158 P |
| 4,691,979 | 9/1987 | Nanska | 339/17 C |
| 4,701,703 | 10/1987 | Malloy | 324/158 P |
| 4,707,655 | 11/1987 | Kruger | 324/158 P |
| 4,717,844 | 1/1988 | Schempp | 439/61 |
| 4,721,908 | 1/1988 | Driller | 324/158 F |
| 4,724,383 | 2/1988 | Hart | 324/158 F |
| 4,730,086 | 3/1988 | Kamijo | 174/74 R |
| 4,735,587 | 4/1988 | Kirayogin | 439/751 |
| 4,744,764 | 5/1988 | Rubenstein | 439/62 |
| 4,755,149 | 7/1988 | de Jong | 439/248 |
| 4,758,186 | 7/1988 | Guglhor | 439/741 |
| 4,789,352 | 12/1988 | Kreinberg | 439/260 |
| 4,793,816 | 12/1988 | Pittman | 439/79 |
| 4,793,817 | 12/1988 | Hiesbock | 439/82 |
| 4,795,362 | 1/1989 | Vonder | 439/377 |
| 4,795,977 | 1/1989 | Frost | 324/158 F |

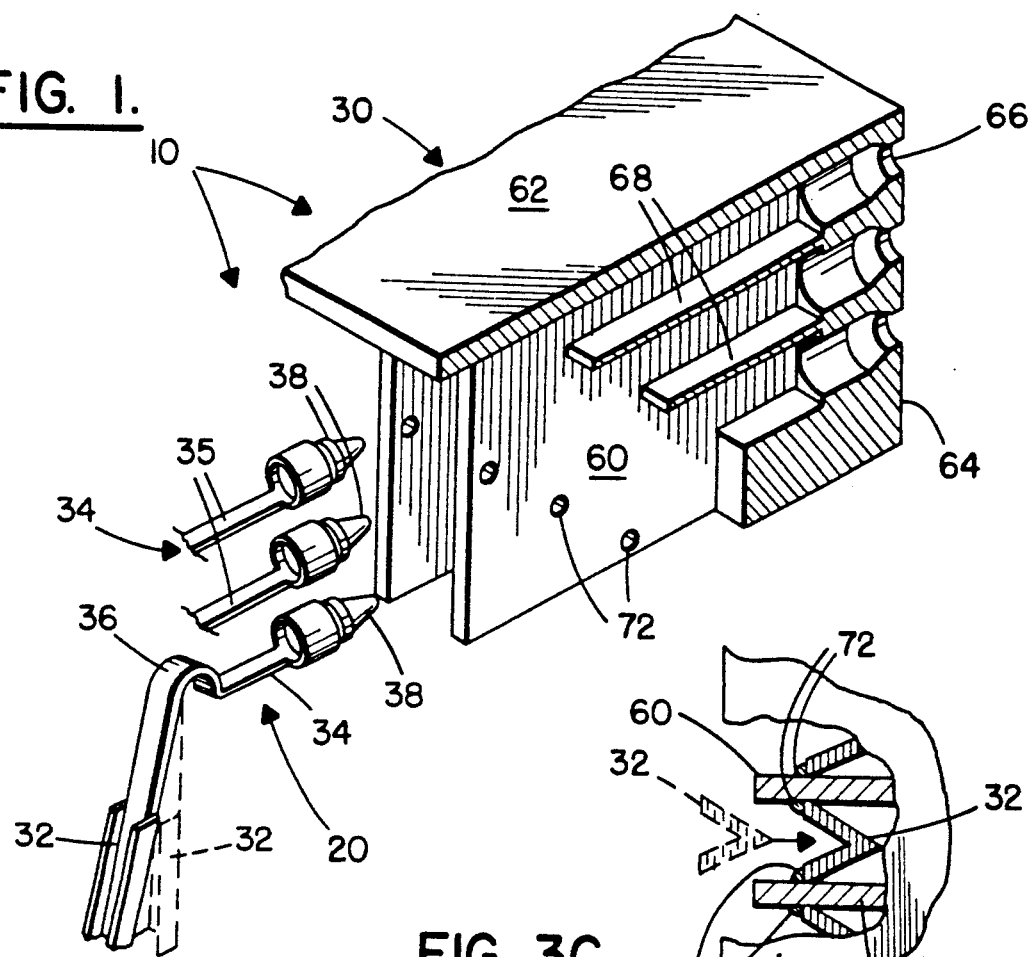
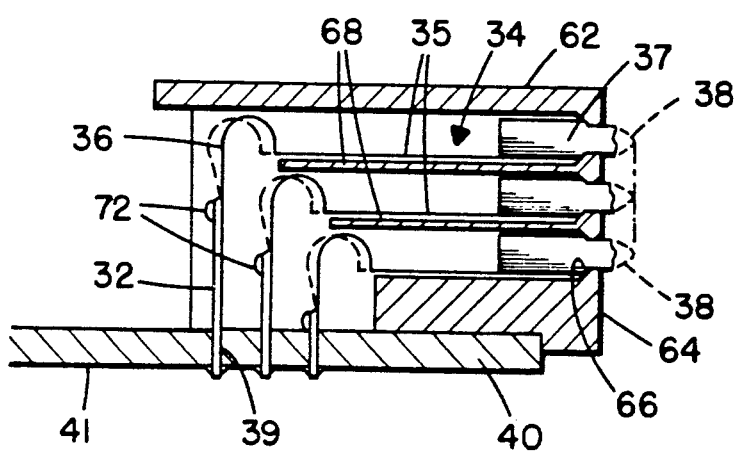

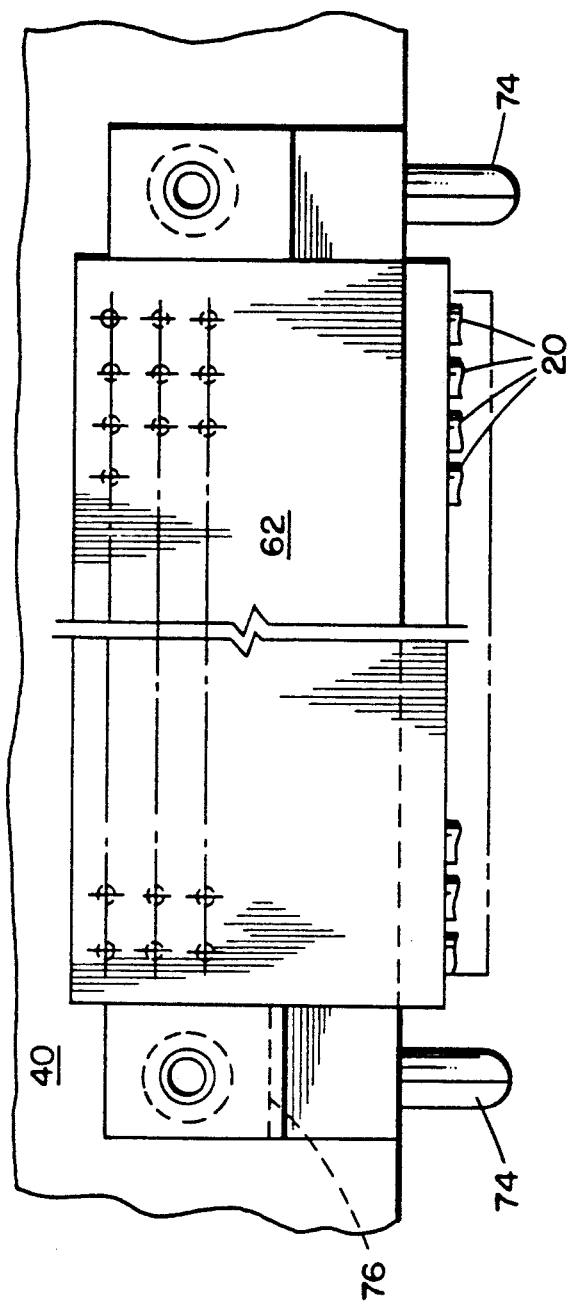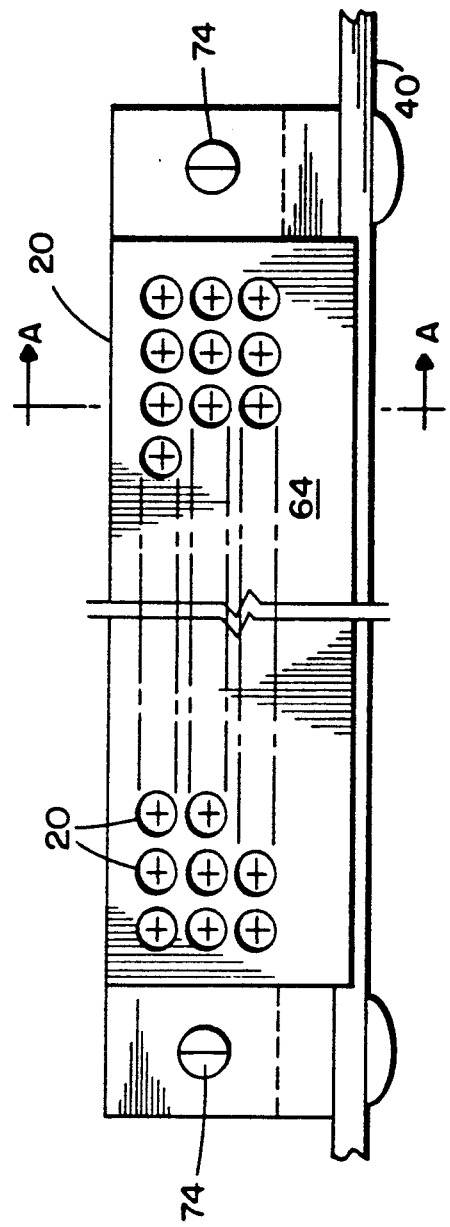
FIG. 2A.
FIG. 2B.

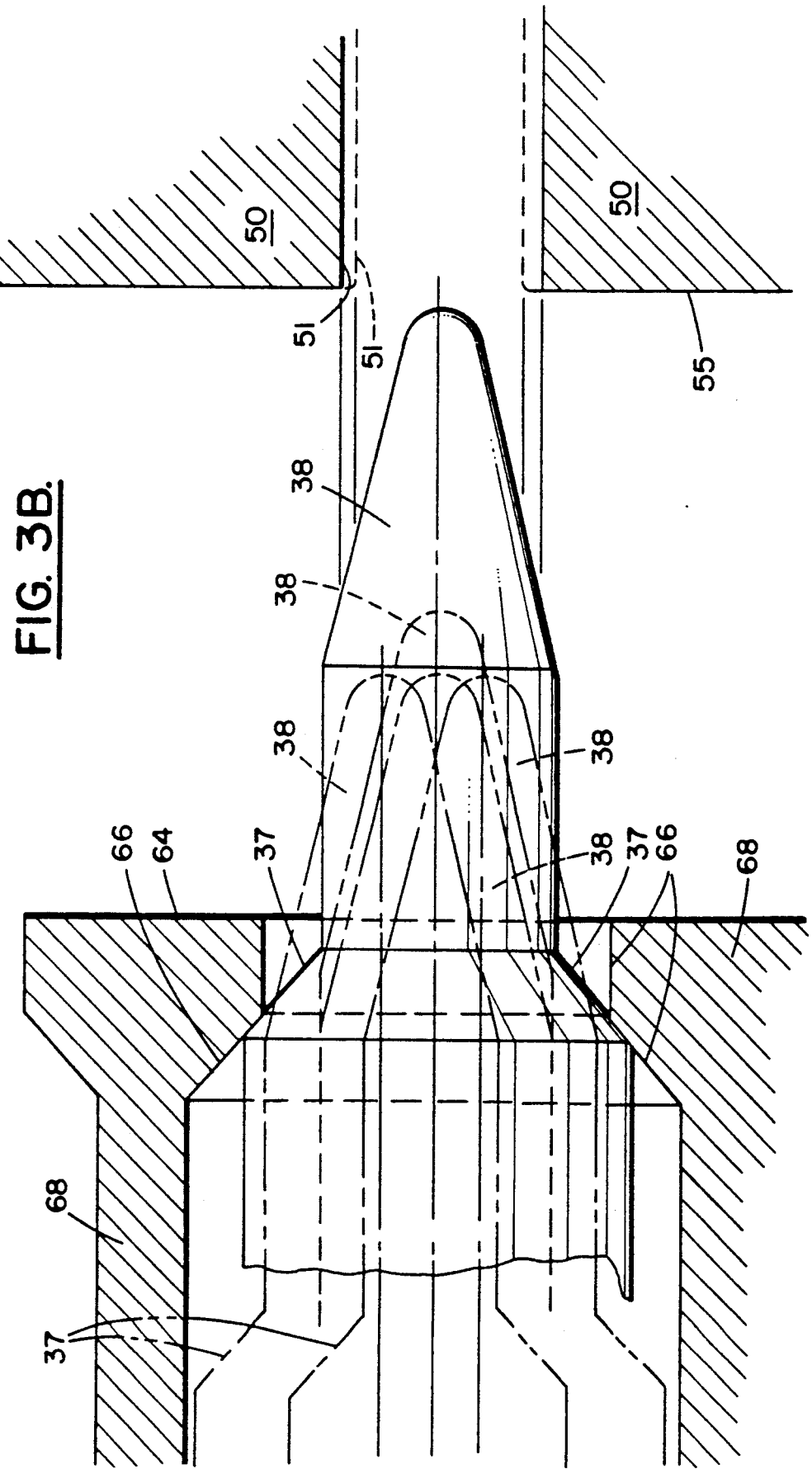

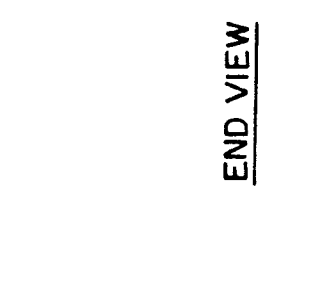
FIG. 5A1. SPHERE FIG. 5B1. CONE FIG. 5C1. 4-EDGE PYRAMID FIG. 5D1. TETRAHEDRON
END VIEW
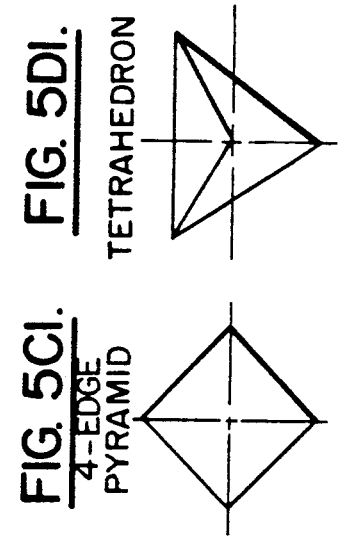
FIG. 5A2. FIG. 5B2. FIG. 5C2. FIG. 5D2.
SIDE VIEW
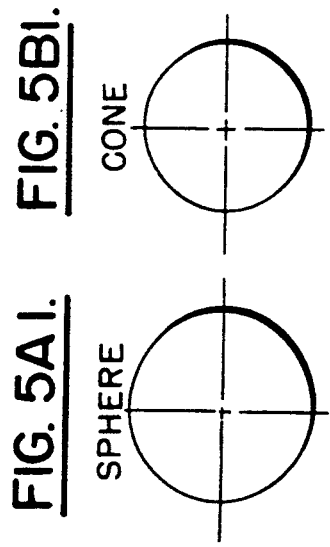
FIG. 5A3. ANNULAR FIG. 5B3. ANNULAR FIG. 5C3. 4-POINT FIG. 5D3. 3-POINT
POINTS OF CONTACT

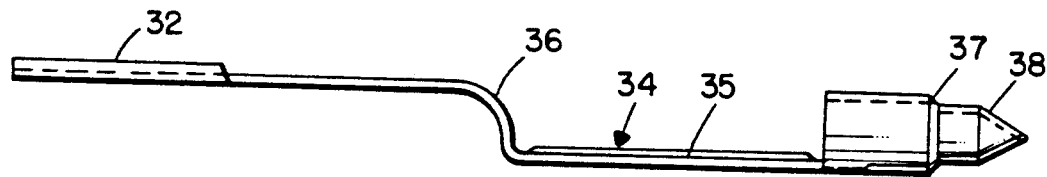
FIG. 6A.
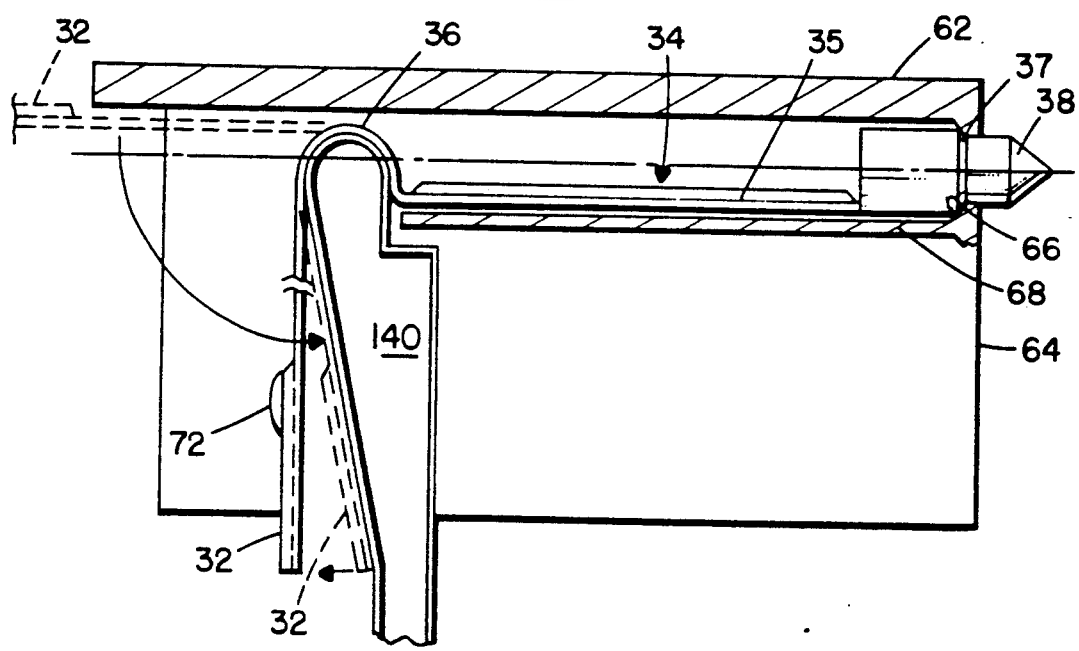
FIG. 6B.
FIG. 7A.
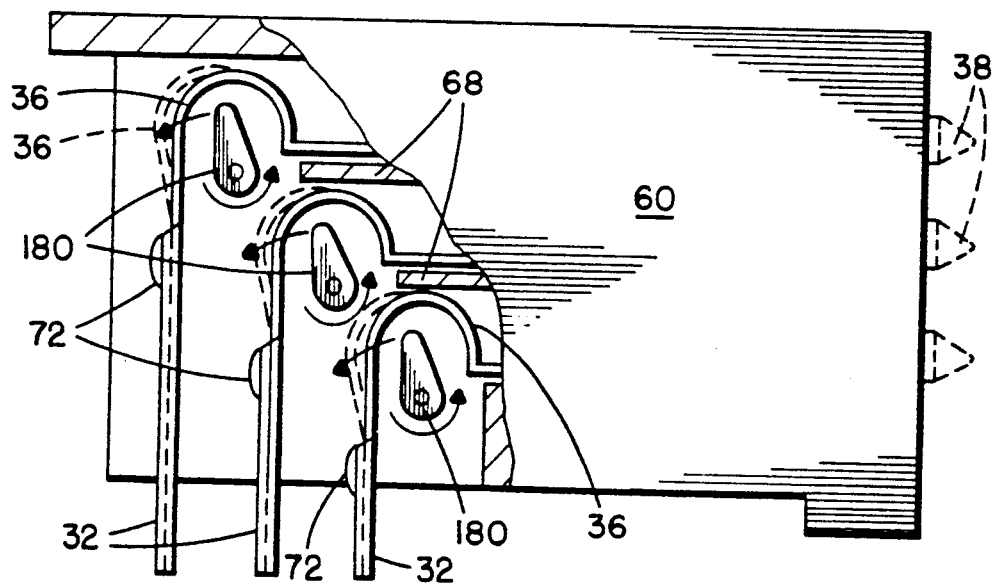

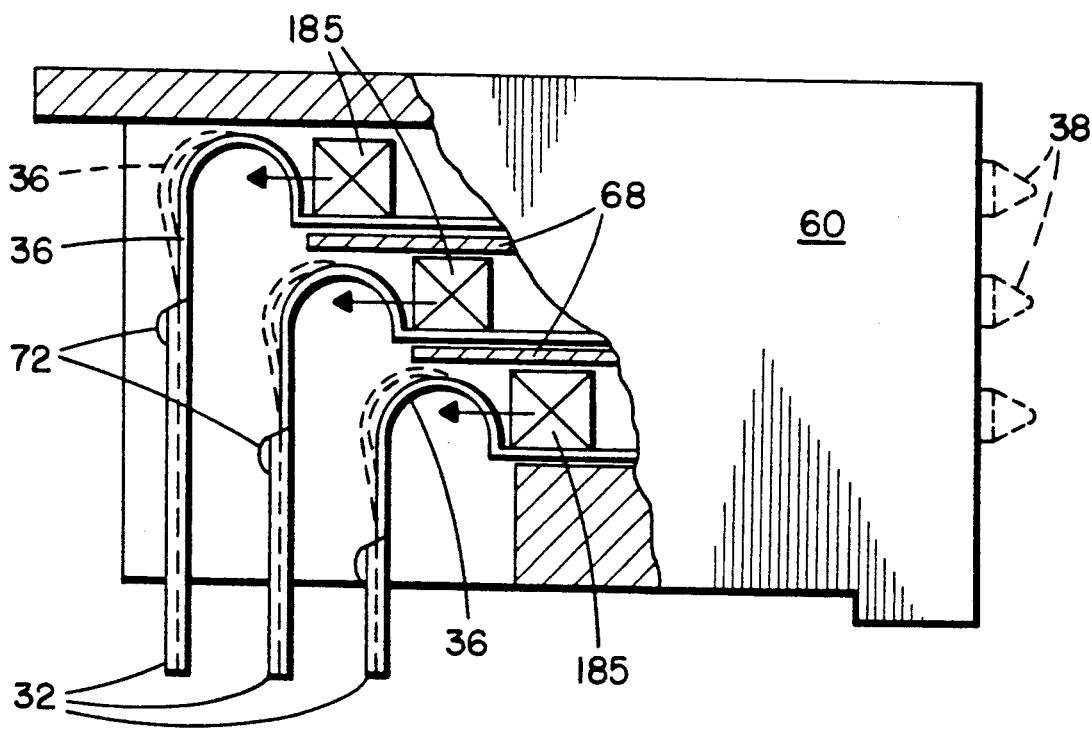

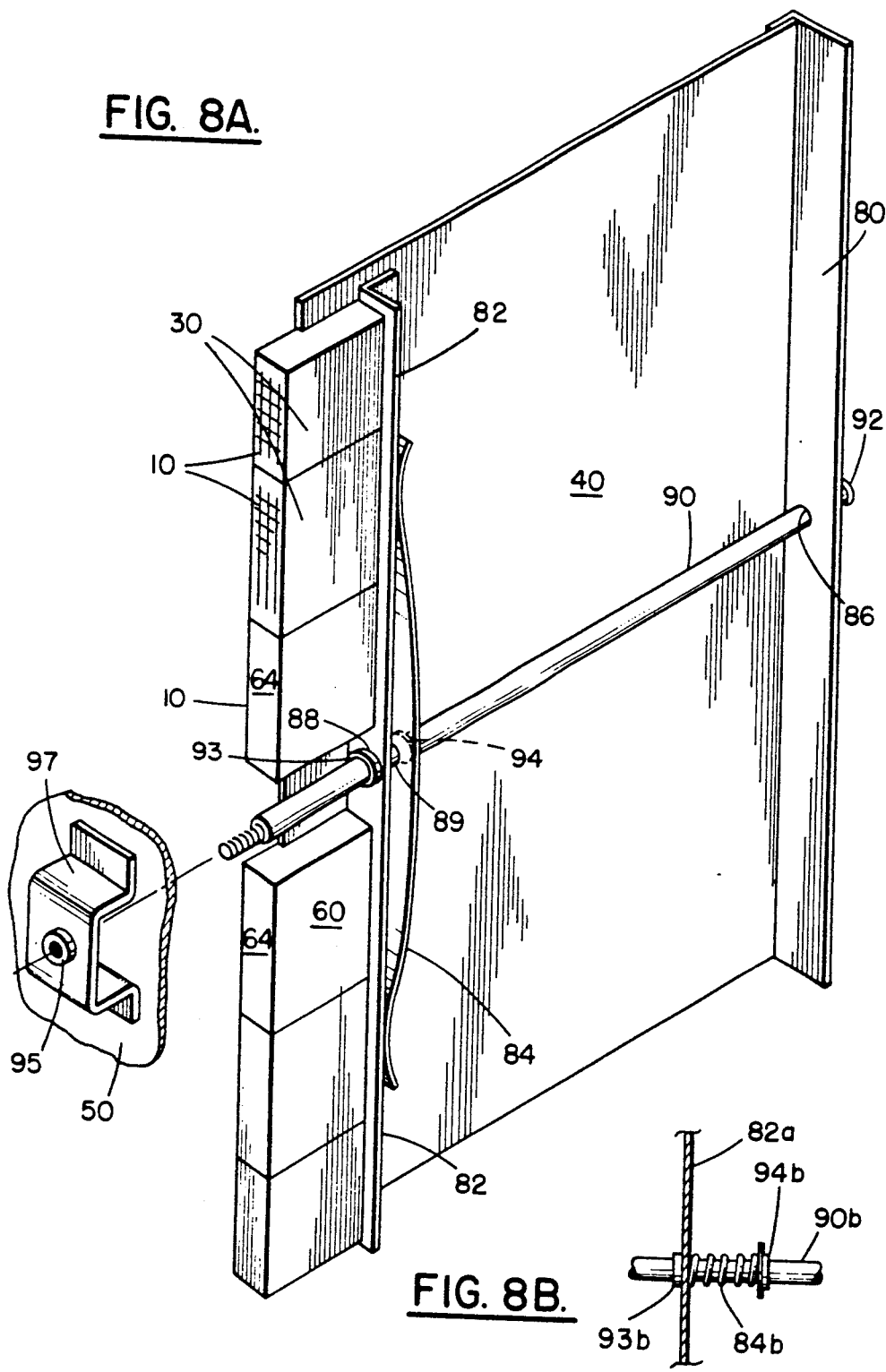

ELECTRICAL CONNECTORS FOR DIRECT CONNECTION TO PLATED THROUGH HOLES IN CIRCUIT BOARD

This is a continuation of Ser. No. 07/605,521, filed Oct. 29, 1990 and now abandoned, which is a continuation of Ser. No. 07/366,546, filed Jun. 13, 1989, which is issued as U.S. Pat. No. 4,966,556.

BACKGROUND

1. Field of the Invention

This invention relates generally to electrical connectors for connecting daughter cards to a backplane, midplane, harness card or the like (hereinafter referred to as a "mother board" or "mother card"). More particularly, the invention relates to a self-centering contact, high density connector for connecting a daughter card directly to the plated through holes of the mother card, where the high density connector may be configured as a standard connector, a zero insertion force connector (ZIF) or as a sequential/selectively engaging pin connector.

2. Prior Art

The electrical connector arts are crowded arts with many categories and subcategories of connectors. One such category are connectors which are used to connect two printed circuit boards (PCB). Within that category is a subcategory of connectors where the first PCB is a mother board, and the second PCB is a daughter board at right angles to the mother board, and the connection is a pluggable connection such that replacement of cards and/or expansion of the system is easily accomplished. The standard connectors for permitting such a non-permanent right angle interface require placing a first piece of hardware (e.g. in the case of conventional inverted DIN connectors, the pin or male part) on the mother board, and a second piece of hardware (e.g. The mating female receptacle of a right angle connector) on the daughter board. While such connectors are typically successful for their purpose, as these connectors grow in size with high pin counts, bowing may occur in the connector during mating due to the high insertion force required resulting in difficult mating between the male and female connector shells. Further, these standard connectors are costly as they essentially require the use of two connector parts (a mating pair) for accomplishing a single connection. In fact, systems are often sold with the mother board portion of numerous connectors already attached to the mother board where daughter cards are only to be optionally provided in the event the system is expanded. Thus, where daughter cards are not ultimately used, unnecessary cost is suffered. In any event, it is desirable to provide an arrangement where connectors fixed to a daughter card could make electrical contact with the mother board directly without the added cost of a mating pair.

One solution to such a mother board/daughter board connection is proposed in U.S. Pat. No. 4,533,203 to Feldman et al., where a single connector having pins which are bent through a ninety degree turn and a two piece dielectric housing for housing the same are utilized in conjunction with contact pads on the mother board to establish contact. First ends of the pins are fixed to the daughter card while second ends are disposed at an oblique angle relative to the mother board to provide "wipe" action on the mating surface. Contact with the mother board is made between the angled second ends and contact pads on the mother board and aligning means are provided for aligning the angled pins and the pads. When contact is made, the bent portion of the pins deflects away from the mother board surface, and is permitted to do so by the housing which is enlarged around the area of deflection. With the provided arrangement, the two connector arrangement is obviated.

While the Feldman et al. patent does overcome some of the problems in the art, it does not address several matters of importance. First, the patent does not provide an adequate manner of maintaining the contact between the connector and the mother board, particularly where contact density is high. While a "keying block" is provided to establish alignment and to permit keying, there is no indication that the keying block also provides a means for establishing and maintaining contact. Second, because of the geometric nature of the angled pins and the contact pads, it is very possible that good contact at a sufficient contact force ("normal force") is not establishable between the pins and the circuit board. Third, where contact density is high, the size of the "engagement" or "hold-in" force (also called "mating" or "insertion" force) necessary for holding down the daughter board so that it may be locked relative to the mother board may very well be prohibitive. This is so, because the Feldman et al. configuration transmits the spring force directly to the contact pad on the mother card without any mechanical advantage. Thus, the "hold-in force" which is equal to the spring force, is also equal to the normal force. Fourth, because of the geometry and nature of the keying block, precise geometries are required, and if not met, may result in malfunctioning of the connector.

SUMMARY OF THE INVENTION

It is therefore an object of the invention to provide a right angled connector for directly connecting a daughter board to plated through holes in a mother board where sufficient normal forces are maintained.

It is a further object of the invention to provide a connector for printed circuit boards where the contact normal force obtained is greater than the hold-in force.

It is another object of the invention to provide a connector for printed circuit boards which accommodates typical production tolerances.

It is yet another object of the invention to provide a connector for printed circuit boards which is configurable for zero insertion force, and selective pin engagement embodiments It is even a further object of the invention to provide a connector for printed circuit boards where the spring-loaded contacts are formed in and by the connector housing.

In accord with the objects of the invention, a connector for connecting a daughter board to a mother board is provided with a plurality of contact elements which are bent over a radius of approximately ninety degrees, and a dielectric housing for housing the contact elements. The connector is used in conjunction with a means for establishing and maintaining force on the contact elements so as to keep them engaged in plated through holes in the mother board. The contact elements are pins with first ends which typically are soldered to through holes in the daughter board, midsections which are crimped and bent through ninety degrees, and second ends which have a converging portion and which terminate in contact portions which are tapered in cross section and which are used to make contact with the contact-quality plated through holes of the mother board. Electrical connection is made by having the tapered contact portion contact the mother board through holes at a plurality of points along the circumference of the hole at the surface of the PCB (i.e. along the rim). The dielectric housing is preferably a single piece housing with a self-centering funnel-like arrangement on the end adjacent the mother board for causing the converging portions of the second ends of the contact elements to center themselves therein in a nominal position and for acting as a stop to cause the pins to be preloaded in a position such that they extend appropriately out of the housing. The housing also preferably includes side-wall locking tabs which hold adjacent rows of contacts at different fixing points relative to the daughter board but at identical fixing points relative to the ninety-degree bend in the contact elements, thereby causing all contact elements to have identical spring parameters. By providing appropriate holes and surfaces in the housing, the contact elements can be manufactured into preloaded spring contacts during assembly by inserting the contact elements in the housing, temporarily holding the contact elements at appropriate locations, and bending the elements so that the first ends are pushed past and locked into place by the side-wall locking tabs. The means for establishing and maintaining force on the contact elements for use in conjunction with the connectors may range from magnets, to spring-loaded jack screws, to bayonet locks, depending on the number of contacts required to be made and the contact force per pin desired.

Additional preferred or alternative aspects of the invention include: arranging the contact elements in the form of compliant split cones for mating with the plated through holes of the mother board; the use of guide pins, at least one of which is grounded, and at least one of which is integrally formed as part of the connector assembly; the use of a stiffening element on the mother board to prevent warpage thereof where a spring loaded jack screw is used for maintaining force on the contact elements; the use of a laminated compliant layer atop a typical mother PCB to permit more effective mating; the use of a raised aligning grid on the mother board for permitting additional lateral tolerance; and the use of rods and/or cams for retracting contact elements (either individually, by row, or all) so as create a ZIF connector and/or a selectively engaged pin enabled connector.

Other objects and advantages of the present invention will become evident upon reference to the detailed description in conjunction with the provided figures.

BRIEF DESCRIPTION OF THE DRAWINGS

FIG. 1 is a perspective view of a column section of the connector invention prior to insertion of the preformed spring contact elements into the housing.

FIG. 2a is a top view of the connector invention showing a row of contact elements with second ends extending appropriately out of the housing.

FIG. 2b is a front view of the connector invention.

FIG. 3a is a cross sectional view of the connector through line A—A of FIG. 2b.

FIG. 3b is an enlarged cross sectional view of the self-centering tapered funnel of the housing shown in FIG. 3a with a contact element located therein in an unengaged extended position, and in engaged depressed positions.

FIG. 3c is a partially cut-away top view of the connector taken along line C—C of FIG. 3a.

FIG. 4b is a cross sectional view of the tapered end of a single preferred split-cone contact element of the connector through line B—B of FIG. 4a.

FIGS. 5a1–5a3, 5b1–5b3, 5c1–5c3, and 5d1–5d3 show alternative embodiments of the tapered end of the contact element, and vertical and horizontal cross-sections therethrough.

FIG. 6a is a side view of a contact element of the invention prior to its formation into a spring contact.

FIG. 6b is partial cross sectional view of the connector of the invention where the contact element of FIG. 6a is shown in the process of being formed into a preloaded spring contact through the use of a tool and the housing.

FIGS. 7a and 7b are partially cut-away side views of the alternative connector of the selective contact actuation or ZIF embodiment of the invention.

FIG. 8a is a perspective view of a spring loaded jack screw for use in conjunction with a plurality of connectors so as to maintain the connectors in contact with the mother board.

FIG. 8b is a side view of an alternative embodiment of a part of the spring loaded jack screw of FIG. 6a.

DETAILED DESCRIPTION OF THE PREFERRED EMBODIMENT

Figure 4A:
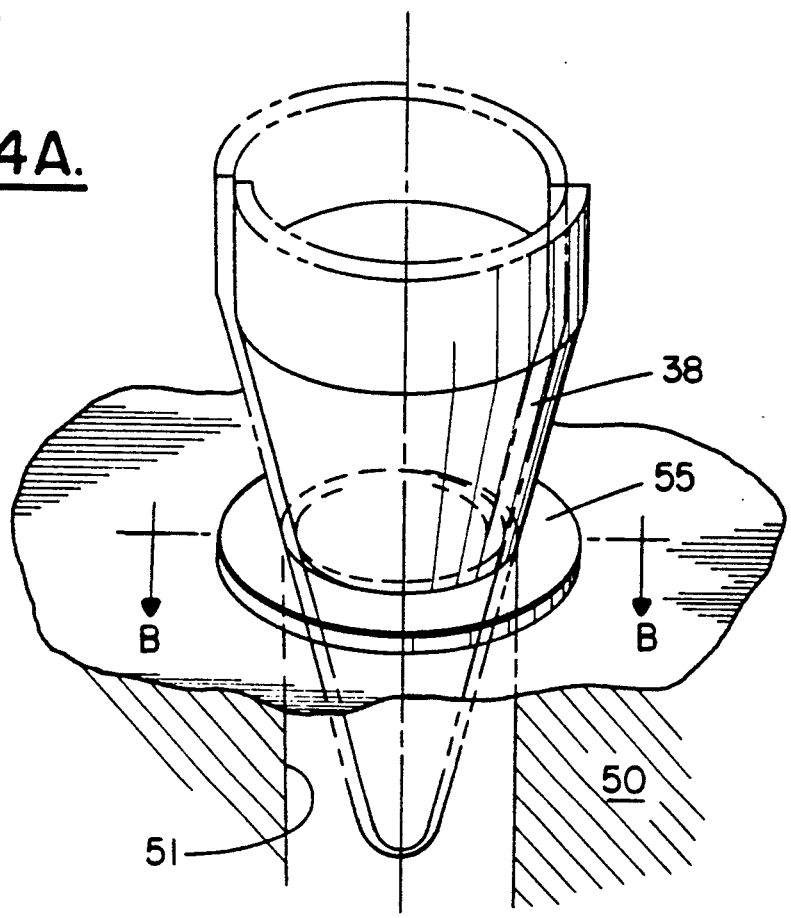
FIG. 4a is a perspective enlarged view of the tapered end of a single preferred split-cone contact element in contact with a preferred embodiment of the mother card plated through hole.

FIGS. 1, 2a, 2b, 3a–3c, and 4a–4c show a first preferred connector assembly of the invention. The connector assembly 10 typically comprises a plurality of contact elements 20, and a dielectric housing 30 for housing the contact elements. The contact elements 30 are spring pins with first ends 32, second ends 34, and a middle bend section 36. The first ends 32 of pins 20 extend through holes 39 in the daughter board 40 and are preferably soldered to the back side 41 of the daughter board. At least a portion of the first ends 32 is preferably v-shaped to help align the first ends in the holes 39 of the daughter board 40. The shape of first ends 32 also provides stiffness, and helps in preloading the contacts as will be discussed hereinafter.

The second ends 34 of the contact elements 30 are basically comprised of a neck portion 35 which may be channel shaped for stiffness, and a tapered contact portion 38. As seen in FIG. 3b, connecting the neck portion 35 to the contact portion 38 is an angled portion 37 which acts in conjunction with the housing to provide self-alignment and preloading as will be described hereinafter.

The mid-sections 36 of pins 20 are preferably crimped to cause pins 20 to form a spring. As shown in FIG. 1, pins 20 are preferably crimped to first form a one hundred eighty degree bend and then a minus ninety degree bend, and are thus essentially bent through ninety degrees. If desired, a simple bend of ninety degrees could be used, provided mid-sections 36 form spring elements. As seen in FIG. 3a in phantom, when contact portions 38 of second ends 34 of pins 30 engage the mother board 50, the mid-sections 36 resiliently deflect away from the mother board 50; i.e. the mid-sections 36 are compliant along the mating axis. In so doing, the mid-sections 36 provide pins 30 with a mating force.

Figure 4B:
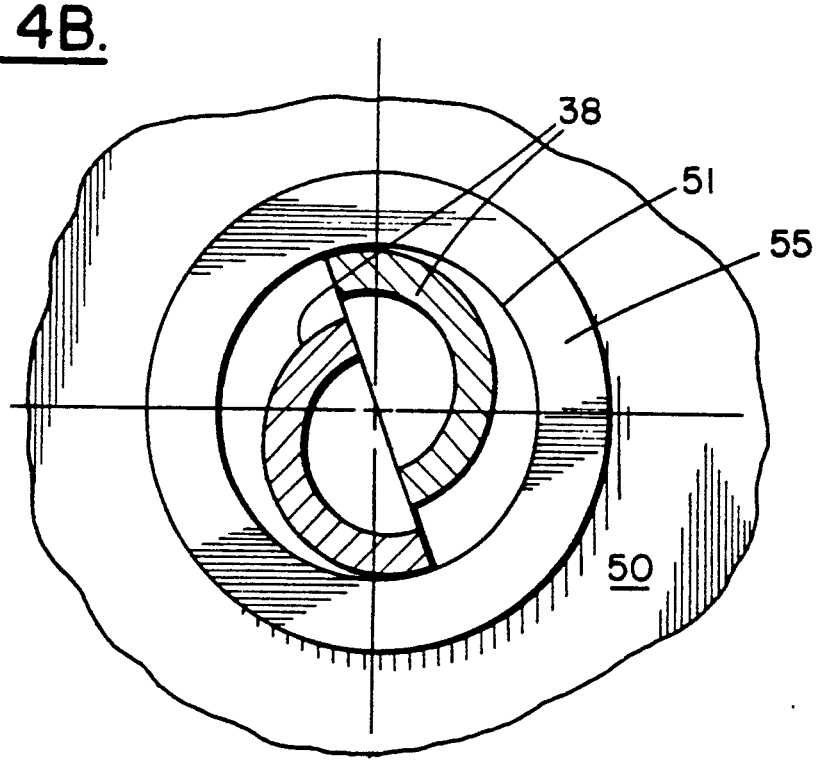

As seen in FIG. 4a, the contact portions 38 of the second ends 34 of contact elements 20 are tapered in cross section, with the cross section becoming larger further away from the end or tip of the contact element. The contact portions 38 are used to make contact with the plated through holes 51 of the mother board 50. Where the contact portions 38 of the second ends 34 are the preferred split (bifurcated) cones (as seen in FIGS. 4a and 4b), contact is made between the connector 10 and the mother board 50 at two points 53a, 53b (radius contact "points") for each contact element 20 and through hole 51. The contact is made between the tapered portion (i.e. the contact portion 38) of the contact element 20 and the rim of hole 51; i.e. the circumference of the hole 51 at the surface 55 of the mother board 50. In making contact, because contact portion 38 is bifurcated, it resiliently compresses as it is pushed into hole 51, and therefore extends into hole 51 further than it might have otherwise. As a result, the surface of contact portion 38 wipes along the rim of hole 51 as it makes contact providing desired "wipe" and enhanced contact.

Figure 4C:
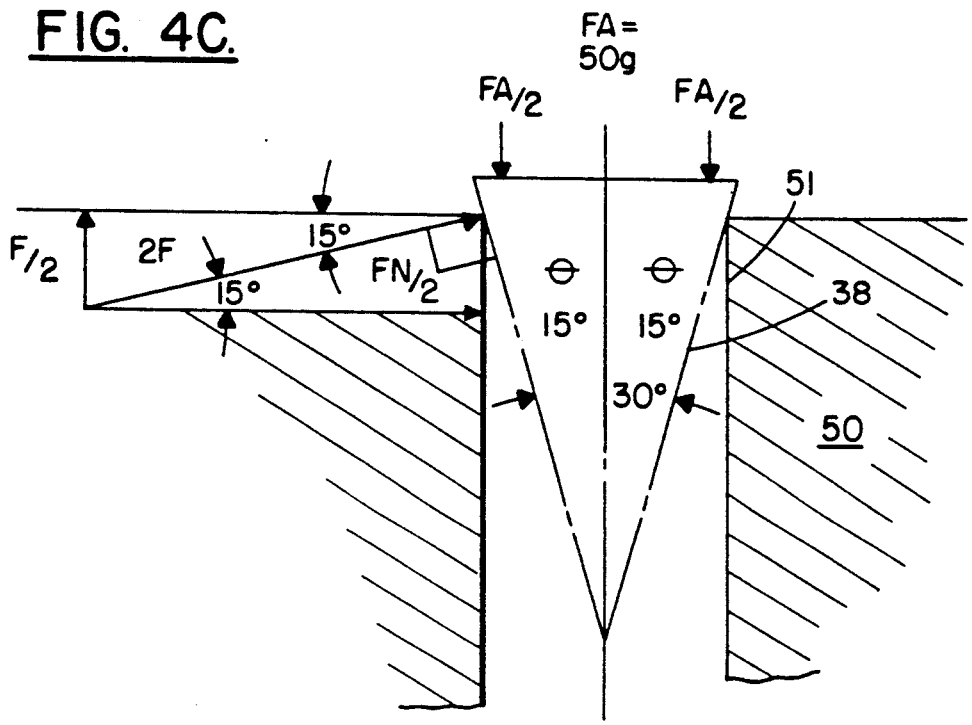
FIG. 4c is a force diagram for a typical contact element of the connector, showing both axial insertion (hold-in) and mating contact normal forces.
Figure 4D:
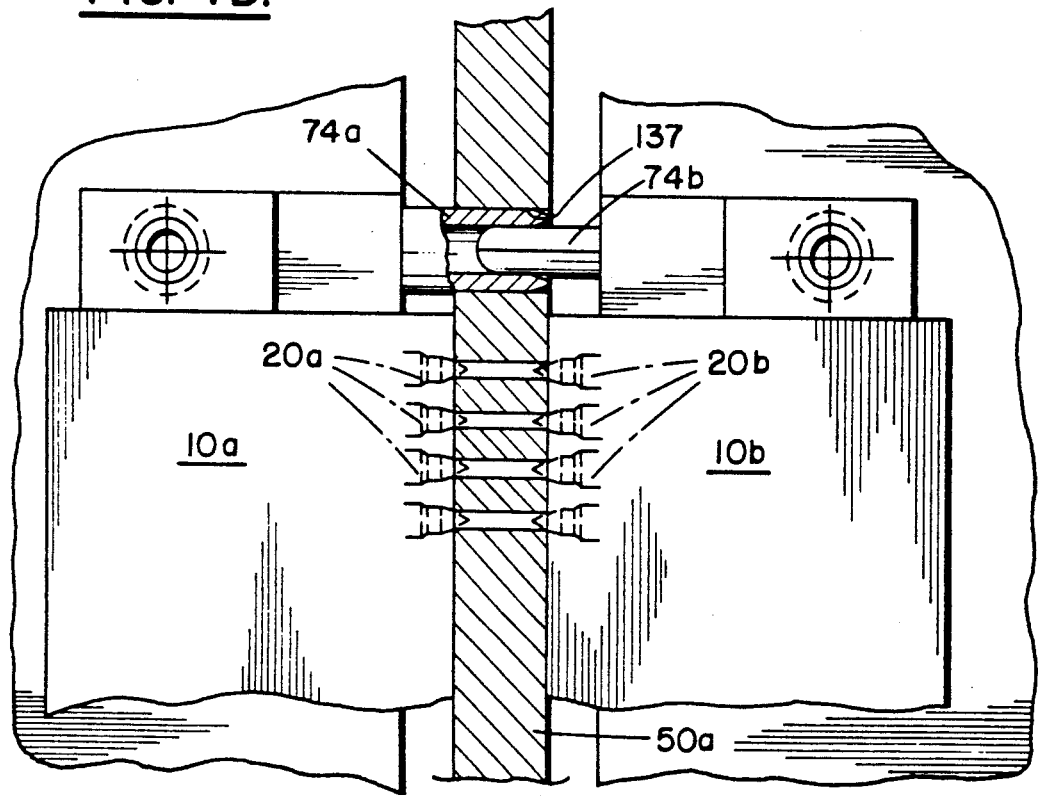
FIG. 4d is a cross sectional view of an embodiment of the invention where two connectors are connected to a mid-plane.

As seen in idealized force diagram of FIG. 4c, the use of contact elements having tapered contact portions 38 which extend into plated through holes 51 of a mother board magnifies the "normal" force relative to the axial holding or mating force. In particular, and by way of example only, if the axial mating force $F_A$ is fifty grams, the axial mating force at each of the two points of contact is seen as twenty-five grams ($F_A/2$). Of course, the mother PCB must assert an equal but opposite force of twenty-five grams at each point. However, the equal but opposite force must be asserted as a component of a force which is perpendicular (i.e. normal) to the point of contact. Thus, at s each of the two contact points, the mother board 50 provides a normal contact force $F_N/2$ (shown as the hypotenuse of the triangle). Each normal contact force is the result of two perpendicular forces; an axial force of twenty-five grams opposite to the mating force (as required to provide an equal but opposite force to the axial mating force); and a force perpendicular to the axial force. As will be appreciated, the perpendicular forces to the axial forces are equal and opposite each other and therefore cancel.

Assuming that the contact portion 38 tapers at an angle of fifteen degrees relative to the axial direction, in order for a twenty-five gram axial force opposite to the axial mating force to be generated at each point of contact, a resultant normal force ($F_N/2$) of one hundred grams (twenty-five grams divided by the sine of fifteen degrees) is generated at each point. Thus, for a pin having a total axial mating force of fifty grams, the normal force generated is two hundred grams. More generically, the normal force generated at each point of contact is equal to the axial force at that contact point divided by the sine of the taper angle $\theta$ of the tapered contact portion 38 of the pin 20. The smaller the taper angle $\theta$, the larger the normal force generated. Regardless of the taper angle, the total normal force generated by all the contact points is always greater than the axial insertion force as $F_N/F_A = 1/\sin \theta$.

Turning to FIGS. 5a1–5a3, . . . 5d1–5d3, it will be understood by those skilled in the art that the tapered contact portion 38 of pin 20 may take any of numerous embodiments. The most conventional candidates would be a sphere, a cone, a four edged pyramid, and a three edged pyramid or tetrahedron. As seen in FIGS. 5a2–5b2, each such contact portion is tapered and would therefore contact the hole. The contact, as seen in FIGS. 5a3–5d3, might range from a three point contact for the tetrahedron, to irregular annular contact for the sphere and cone. While a four point contact would be expected from the four-edged pyramid, it is possible that only two or three contact points would be made. Because of the exact geometries required of the plated through hole and the tapered contact portions of the pins to permit the exact contact points to be ascertained, the compliant bifurcated cone of FIG. 4a and 4b is the preferred embodiment, followed by the tetrahedron.

Returning to FIGS. 1, 2a, 2b, and 3a–3c the preferred single piece dielectric housing 30 of the invention is seen. The housing 30 includes side walls 60 which separate and electrically insulate each column of contact pins 20; the side walls 60 extending perpendicularly from top wall 62. Also extending perpendicularly from top wall 62 is front wall 64 having a plurality of openings 66 for permitting at least a portion of tapered contact portions 38 (and preferably the entire tapered contact portion) of contact pins 20 to extend therethrough. Openings 66 are preferably tapered funnels which are arranged to interact with the angled portion 37 of the second ends 34 of the contact pins as will be hereinafter described. Extending rearward from the front wall 64 in a manner parallel to top wall 62 are a plurality of pin separation walls 68 (also called "guide walls") which guide the second ends 34 and contact portions 38 of pins 20 into their preloaded position, and electrically insulate one pin contact from another. Because different rows of pins 20 traverse different lengths (as seen in FIGS. 1 and 3a), the lengths of separation walls 68 are varied accordingly. Preferably, each guide wall extends slightly past the middle bent portion 36 of the pin contact below it, but only as far as the second end 34 of the pin above it.

FIG. 3b explores the axial and lateral tolerances built into the connector contact pins relative to the plated through holes of the mother board. As shown, when the contact pins are not engaging the mother board, angled portions 37 contact the funnel-like openings 66 and thereby center themselves herein in a nominal position. By arranging openings 66 to be smaller in cross section than the cross section of the widest part of angled portion 37, the openings 66 act as a stop to the contact spring pins 20 to cause the spring pins to be preloaded in the housing, as will be discussed hereinafter. In the preloaded position, the contact portions 38 of the pins 20 extend out of the housing 30 by a desired amount. When the contact pins 20 engage the mother board holes, the pins 20 are pushed backward (as seen in phantom) such that the angled portion 37 of the second ends 34 of the pins no longer contacts the funnel-like openings 66 of the housing 30. As a result, lateral movement of the second end of the pin is expedited in all directions, as the passage for the second end of the pin defined by adjacent side walls 60 and adjacent guide walls 68 of the housing 30 is wider than the second ends 34 of the pins. As will be appreciated by those skilled in the art, the further pins 20 are pushed backward, the more second ends 34 can move laterally in any direction in the housing passage. As a result, a tolerance zone or range for the misalignment of a pin relative to a hole is provided which can approach the radius of the hole in size (provided the housing passage and funnel-like opening are large enough) Also, as seen in FIG. 3b, the tapering of the contact portion 38 of pin 20 provides tolerance relative to the hole diameter, as contact along the tapered surface of the contact portion 38 is guaranteed.

As seen in FIGS. 1, 3a, and 3c, side walls 60 of housing 30 preferably include side-wall locking tabs 72 (preferably two per contact) which hold adjacent rows of contacts in a preloaded manner at different fixing points relative to the daughter board 40 but at identical fixing points relative to the ninety-degree bend portion 36 of the contact elements 20. The locking tabs 72 provide a restriction between adjacent side walls 60 through which the v-shaped first end 32 of pins 20 are forced during assembly. After the v-shaped first end 32 deforms and passes through the tabs 72, they cannot return past the tabs 72. Thus, locking tabs 72 act to provide a preload to the spring contact elements 20 as the spring contact elements 20 are fixed in location on one end by the contact of angled portion 37 with the funnel-like opening 66, and on the other end by locking tabs. The locking tabs 72 also act to establish a fixing point which fixes a portion of first end 32 (the portion between the locking tab 72 and the daughter board) against movement in the axis of insertion. As a result, the tabs 72 act as a strain relief for the first end 32—daughter board solder joint, as the first end 32 will not substantially move below tab 72. The y-shape of first end 32 also helps to stiffen first end 32 and to prevent movement at the solder joint.

By locating the locking tabs 72 such that pins of different rows have approximately the same spring length between the fixing point and the bend (as seen in FIGS. 1 and 3a), equal bearing forces between the contact portions 38 of pins 20 of different rows of the connector and the holes 51 of the mother board 50 are assured.

Housing 30 may also include at least one integral guide pin 74. Guide pin 74 may act as a ground pin by having a ground wire (not shown) wrapped around it, and/or a make first pin for the connector. Typically, and as shown in FIGS. 2a and 2b, two guide pins 74 are located on either end of the connector and extend along the same axis as the second portion of pins 20. Preferably, the guide pins extend out further than the contact portions 38 of pins 20 and thus act in a shielding or protective capacity. The guide pins 74 are preferably arranged such that they extend into mating holes in the mother board, with the diameter of the mating holes being as large as or slightly greater than the diameter of non-tapered section of the guide pin. While at least one guide pin is preferably integrally molded with the connector, other guide pins may have a threaded end, and are held in place in the housing 30 by nuts 76. If desired, first and second guide pins may be oval in cross-section and oriented perpendicularly with respect to one another. In this manner, one guide pin acts as a horizontal guide, while the other acts as a vertical guide.

Where connectors are used in conjunction with a mid-plane, the guide pin arrangement is preferably altered. As seen in FIG. a first connector 10a with spring contact elements 20a, and a second connector 10b with spring contact elements 20b are mating with the midplane 50a via plated through holes. Midplane 50a includes a guide hole 137 which is slightly larger in diameter than typical guide holes, and connector 10a includes a hollowed guide pin 74a which mates with guide hole 137. Connector 10b is a connector according to the teachings of the invention with a standard guide pin 74b which mates with hollowed guide pin 74a. By providing an increased diameter guide hole 137 in the midplane, and by providing connector 10a with a hollowed guide pin 74a, conflict between the guide pins of connector 10a and 10b is avoided. Also, if guide pins 74a and 74b are arranged to be conductive, a first make arrangement is accomplished.

As seen in FIG. 6b, the manufacture of the spring contacts for the preferred connector of the invention can be completed, and the spring contacts can be preloaded during the assembly of the connector. The contact element 20 of the invention is seen in FIG. 6a prior to its insertion into the housing 30. Contact element 20 includes contact portion 38, angled portion 37, second end 34, middle portion 36, and first end 32. As shown, part of first end 32 is v or u shaped, and part of second end 34 is ribbed or channel shaped. Middle portion 36 is provided with a "dog's-leg" bend. In manufacture/assembly, the contact element 20 of FIG. 6a is inserted into housing 30 with side walls 60 and guide walls 68 acting as guides, until angled portion 37 of the contact element 20 engages funnel-like opening 66 of the housing. A bending fixture 140 is then preferably inserted between side walls 60 of the housing such that a rounded portion of the bending fixture engages the dog's leg bend in the contact element. With bending fixture 140 held in place, the first end 32 of the contact element is forced downward by a press (not shown), with the v-shaped first end 32 being forced past locking tabs 72, until the first end 32 is brought into contact with the angled surface 142 of bending fixture 140. When the press is withdrawn, first end 32 springs back and bending fixture 140 is removed. However, first end 32 can only spring back to the vertical position of FIG. 6b because it is restrained by locking tabs 72. Hence, contact elements 30 are preloaded. Also, because the first end 32 of contact element 20 does not spring back to its original shape of FIG. 6a when locking tabs 72 are not present, but rather assumes the position of the spring contact elements of FIG. 1a, the process of bending the contact element 20 is seen to form the contacts into spring contacts. Thus, a connector whose preloaded spring contacts are actually partially manufactured during assembly is provided.

Because contact elements 20 are preloaded spring contacts, with locking tabs 72 acting as fixing points, if the contact portions 28 of the spring contacts 20 are withdrawn into the housing 30, the resulting connector functions as a ZIF connector; i.e. the connector housing can be brought into contact with the mother board with the use of nominal force. Two embodiments for retracting contact portions 28 are shown in FIGS. 7a and 7b. In FIG. 7a, retracting cams 180 are provided and can be fixed to side walls 60. By rotating the cams as indicated, the middle portion 26 of the spring contacts 20 is forced backward (as shown in phantom), thereby drawing contact portions 28 back towards or into housing 30. After the connector is brought into contact or into close proximity with the mother board and locked into place, cams 180 may be further rotated to release spring contact 20 and permit mating. It will be appreciated that if a single cam is provided for each row of contacts, the rows may be selectively activated. If a cam is provided for each contact, each contact may be selectively activated. Similarly, in FIG. 7b, non-conductive retracting bars 185 which can move along the axis of the second portion 34 of spring contacts 20 are provided to force middle portion 26, and hence contact portion 28, backward and provide a ZIF connector. If retracting bars 185 may also be perpendicularly retracted, sequential individual activation of contacts in a single row may be accomplished.

Turning to FIGS. 8a, 8b, 9a and 9b, various means for establishing and maintaining force on the contact elements when they engage the holes in the mother board are provided. As shown in FIG. 8a, the daughter board is provided with a front panel 80, and a stiffening bar 82, with the stiffening bar preferably fastened to the connector housing 30 or bearing against the connector housing at the back face (the face opposite front wall 64) thereof. Also provided is a leaf spring 84 with ends abutting the stiffening bar 82 and a middle which bows away from the leaf spring in a direction away from the connectors. Midway along the front panel, the stiffening bar, and the leaf spring 84 are holes 86, 88, and 89 for accepting a rod or shaft 90 which extends past therethrough. On one end of rod 90 is a thumbscrew 92 or the like with an enlarged head which permits turning of the rod. Retaining rings 93 and 94 (which is shown in phantom) are also attached to rod 90, with the rings 93 and 94 located on the non-adjacent faces of stiffening bar 82 and leaf spring 84 respectively. The second end of rod 90 is threaded and terminates in a shoulder. The threaded section of rod 90 extends past the front face 64 of connectors 10, through a hole in mother board (back plane) 50 and is arranged to engage a tapped bushing 95 located on a stiffening channel 97 which runs along the mother board 50. Stiffening channel 97 serves to stiffen the mother board 50 so as to prevent bowing of the same due to the large forces exerted by the leaf spring in keeping connectors 10 mated in the through holes of the mother board 50. The entire arrangement of FIG. 8a is particularly advantageous where there are a large number of contacts in a connector and the total force of engagement is appreciable as the connector is held to its portion of the mother board without putting undo stress on either the daughter card, the rest of the mother card, or the mother card cage structure.

As seen in FIG. 8b, different spring arrangements could be used in conjunction with the preferred connectors for keeping the connectors engaged in the mother board. In FIG. 8b, instead of a leaf spring, a standard spring 84b is used between the stiffening bar 82a and retaining ring 94b. In essence, the system works in an identical manner to that of FIG. 8b.

Figure 9A:
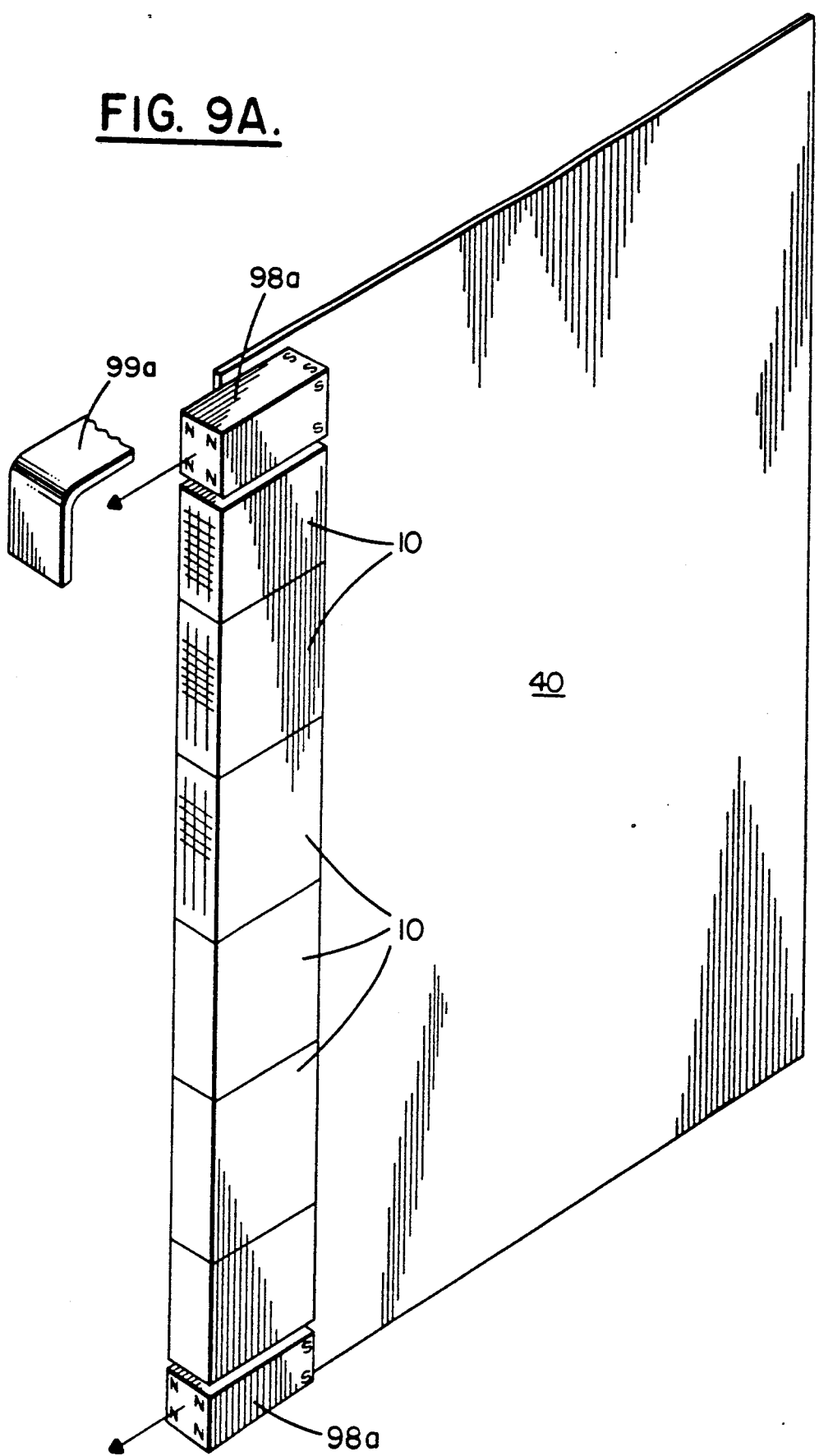
FIG. 9a is a perspective view of a first magnet system for use in conjunction with a plurality of connectors so as to maintain the connectors in contact with the mother board.
Figure 9B:
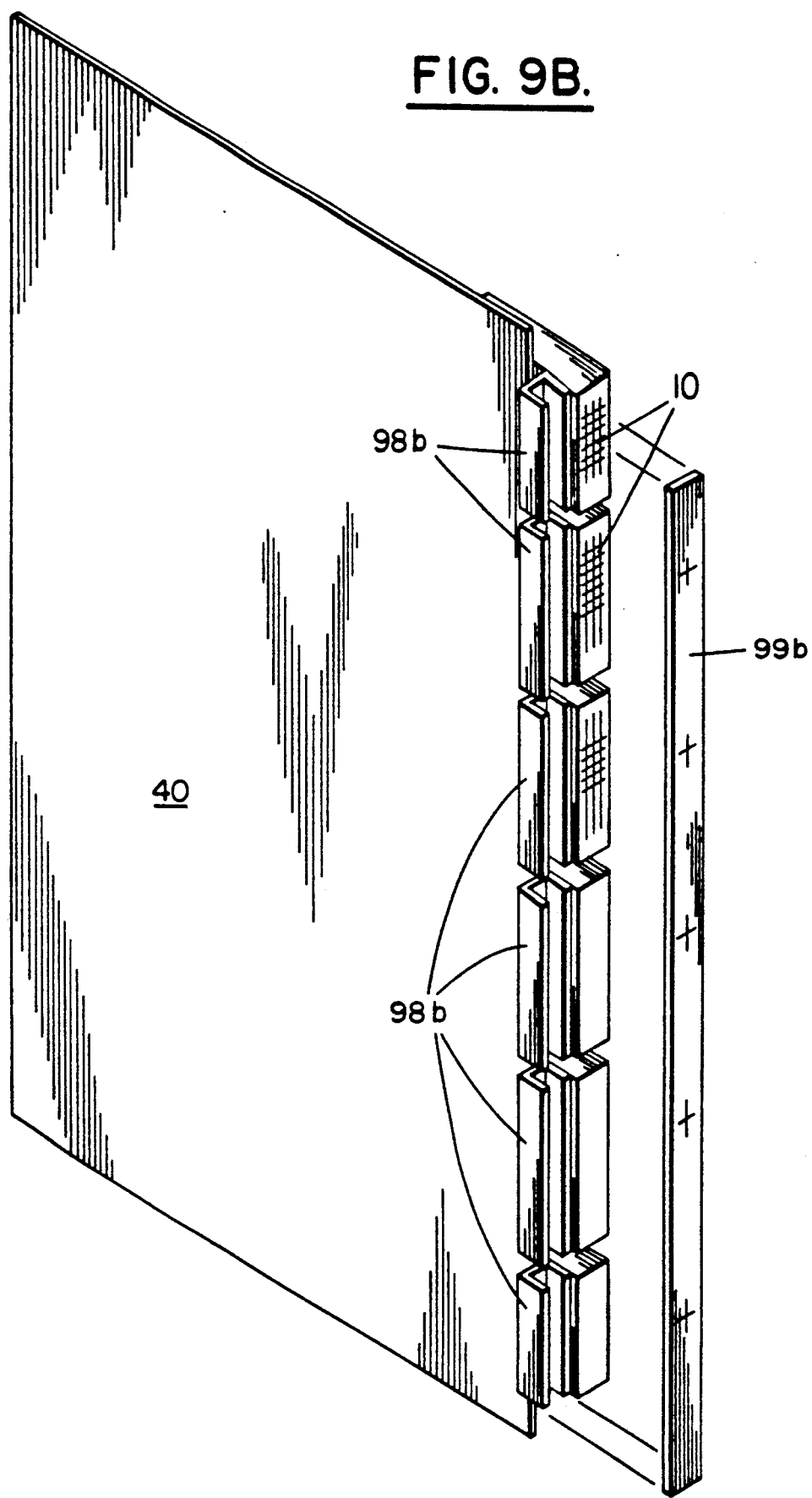
FIG. 9b is a perspective view of a second magnet system for use in conjunction with a plurality of connectors so as to maintain the connectors in contact with the mother board.

Other means of establishing and maintaining force on the connectors are shown in FIGS. 9a and 9b. In FIG. 9a, simple bar magnets 98a are attached to the daughter PCB 40, with one magnet on either side of the connectors 10. Identical poles of each magnet are arranged to face the mother board (not shown) which is provided with one or more steel plates 99a as an attracting surface. In FIG. 9b, horseshoe magnets 98b are located alongside each connector 10. A steel strip 99b s provided on the mother board to provide an attracting surface for the magnets.

Figure 10A:
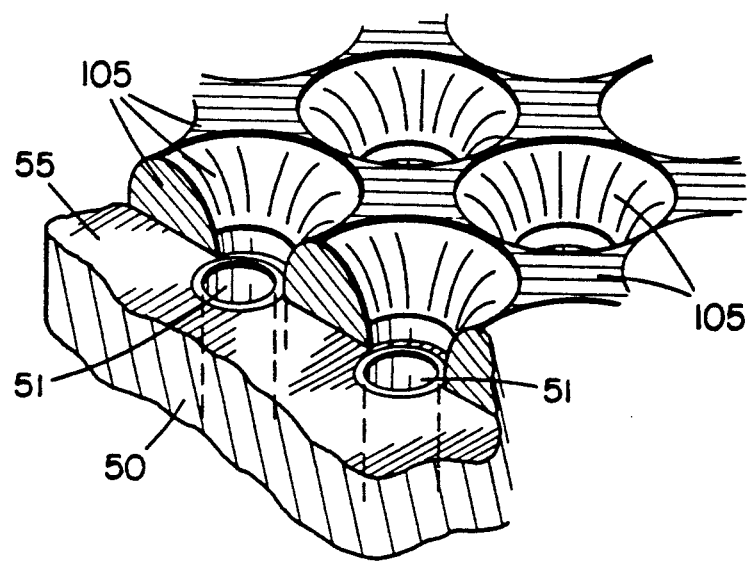
FIGS. 10a and 10b are respectively a partially cut-away perspective view and enlarged cross-sectional view of a first alternate embodiment of the mother board of the invention which incorporates an alignment grid which permits increased alignment tolerance for the connector invention.
Figure 10B:
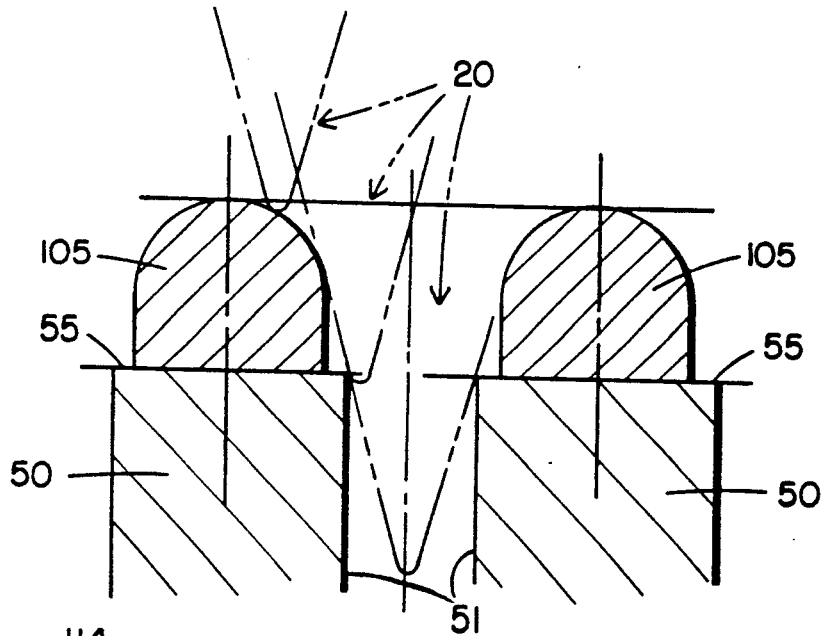
Figure 11:
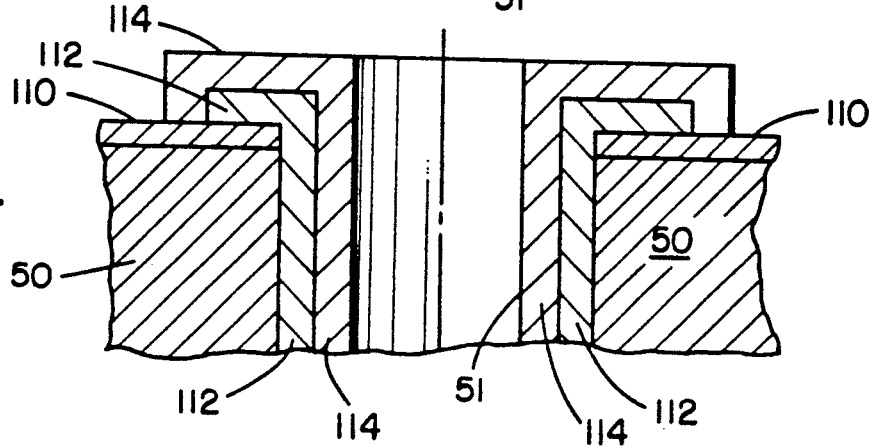
FIG. 11 is an enlarged cross-section of a second alternate embodiment of the mother board which includes a special compliant layer over a standard PCB board for enhancing contact performance.

Turning to FIGS. 10a, 10b, and 11, changes to the mother board are shown for enhancing the invention. In FIGS. 10a, and 10b, grid elements are provided on the surface 55 of the mother board 50 around each hole 51. The grid elements 105 are shaped so as guide the contact portion 38 of the contact elements 20 towards hole 51 without stubbing contact portion 38. As seen in FIGS. 10a and 10b, the preferred grid structure shape is substantially parabolic. However, many other shapes can be utilized.

Grid elements 105 provide the connector invention with additional misalignment tolerance relative to the mother board which is particularly useful where relatively large spacing is used between mother board holes. Without the grid elements, the maximum misalignment tolerance of the spring elements 20 of connector 10 with a hole 5 is the radius of the hole. With grid elements 105, the maximum alignment tolerance of the pins to the holes is significantly increased to one half the distance between the holes 51. Such an alignment tolerance is very large compared to other connectors of the art.

In FIG. 11, an additional compliant layer 110 is shown as an integral part of a specially laminated mother board 50. Compliant layer 110 is preferably laminated to a conventional FR-4 printed circuit board and provides an appropriate matching compliance for the contact elements 20. As seen, through hole 51 of the mother board 50 is provided with standard copper plating 112. Preferably, gold over nickel (although other contact-quality platings could be used) plating layer 114 is provided atop the copper plating 112 and serves to provide the mating contact surface for the spring contacts 20. The compliant layer 110 can be provided in situations where additional wipe is required, and/or where frequent insertion of daughter cards is expected.

There has been described and illustrated herein electrical connectors for directly connecting daughter boards to plated through holes of a mother board. While particular embodiments of the invention have been described, it is not intended that the invention be limited thereby, as it is intended that the invention be broad in scope and that the specifications be read likewise. Thus, while a one part housing has been disclosed for use with preloaded spring contacts, it will be appreciated that the housing disclosed in U.S. Pat. No. 4,533,203 to Feldman et al. would suffice. Also, regardless of whether a one or two piece housing is used, it will be appreciated that the use of locking tabs is not mandatory. However, if fixing points are not provided, the characteristics of each contact will have to be different in order to create even mating forces across all of the pins. Further, while particular spring contacts, with a middle portions having a semicircular loops, first ends having v-shaped cross sections, contact portions of any of various tapered cross sections, etc. have been described, those skilled in the art will appreciate that the contact elements can take various other embodiments, provided, however, that they provide a spring force when mating. In fact, while preloading of the spring elements is highly desirable, it is not mandatory for the invention to properly function. Also, while the first end of the spring contacts were described as being soldered to the daughter board, it will be appreciated that other manners of fastening such as compliant press fit, surface mounting, etc. could be used. Likewise, while the housing and second ends of the spring elements were respectively described as having funnel-like openings in a front wall, and angled portions of the spring element second portions which cooperate with each other, it will be appreciated that geometries other than that shown could be utilized. The funnel need not be conical (i.e. the term "funnel-like" being used in its broad sense to suggest a narrow opening and widening out to a large open mouth), while the angled portion need not be straight, providing it does converge. Moreover, the angled portion of the second end need not be circular in cross section, as fins could be utilized for centering purposes.

It will also be appreciated by those skilled in the art that different means for maintaining sufficient forces to hold the connector to the mother board other than those illustrated may be provided. For example, numerous fasteners found in the Quarter Turn Fastener Section B of the Southco Fastener Handbook 39, published by Southco of Concordville, Pa., will suffice. Similarly, under many conditions, the fasteners of FIGS. 8a and 8b without the springs will suffice. Indeed, where the connectors of the invention are provided with ZIF capabilities, many additional fastener arrangements will suggest themselves. It will likewise be appreciated that the connector invention will have application for connecting parallel PCBs as well as other applications. Therefore, it will be apparent to those skilled in the art that other changes and modifications may be made to the invention as described in the specification without departing from the spirit and scope of the invention as so claimed.

We claim:

1. An electrical connector for providing a substantially right angled connection between a first board and the conductive rims of holes of a second board, comprising:
   a) a plurality of electrically isolated spring contact elements, each spring contact element having a first portion for electrically contacting said first board, a middle portion traversing approximately ninety degrees, and a second portion including a tapered contact portion for mating with a said conductive rim of a hole of said second board; and
   b) a dielectric housing for housing said plurality of spring contact elements.

2. An electrical connector according to claim 1, wherein:
   said dielectric housing comprises a front wall which is substantially parallel with said second board when said electrical connector mates with said second board, said front wall having a plurality of apertures for permitting at least a portion of said tapered contact portion of said spring contact elements to extend therethrough.

3. An electrical connector according to claim 2, wherein:
   said dielectric housing comprises a plurality of side walls perpendicular to said front wall for electrically isolating columns of said plurality of spring contact elements.

4. An electrical connector according to claim 3, wherein:
   said dielectric housing comprises a plurality of guide walls each said guide wall perpendicular to said front wall and said side walls and substantially parallel and adjacent to said second portion of one of said spring contact elements, said guide walls for electrically isolating rows of said plurality of spring contact elements, wherein at least one guide wall adjacent a spring contact element extends from said front wall to but not beyond said middle portion of said spring contact element.

5. An electrical connector according to claim 2, wherein:
   said apertures in said front wall of said dielectric housing are substantially funnel-like in shape, and said second portion of said spring contact element comprises a converging portion for contacting said funnel-like aperture to stop said spring contact element in a desired location.

6. An electrical connector according to claim 5, wherein:
   said funnel-like aperture of said front wall of said dielectric housing and said converging portion of said second portion of said spring contact element are arranged to cause said spring contact element to be preloaded.

7. An electrical connector according to claim 5, wherein:
   said dielectric housing comprises a plurality of side walls substantially perpendicular to said front wall for electrically isolating columns of said plurality of spring contact elements, and
   said plurality of side walls have locking tabs for holding said first portions of said spring contact elements at fixing points which cause said spring contact elements to be preloaded.

8. An electrical connector according to claim 7, wherein:
   said first portions of said spring contact elements have at least a portion which is substantially v-shaped where the v-shaped portion is substantially compliant to permit said v-shaped portion to be forced by said locking tabs in a first direction, but rigid enough to resist movement of said v-shaped portion past said locking tabs in a second direction opposite to said first direction.

9. An electrical connector according to claim 8, wherein:
   said locking tabs are arranged on said side walls of said dielectric housing so as to hold said first portions of said spring contact elements at different fixing points relative to said first board but at identical fixing points relative to said middle portions of said spring contact elements.

10. An electrical connector according to claim 3, wherein:
    said plurality of side walls have locking tabs for holding said first portions of said spring contact elements at fixing points which cause said spring contact elements to be preloaded.

11. An electrical connector according to claim 10, wherein:
    said first portions of said spring contact elements have at least a portion which is substantially v-shaped where the v-shaped portion is substantially compliant to permit said v-shaped portion to be forced by said locking tabs in a first direction, but rigid enough to resist movement of said v-shaped portion past said locking tabs in a second direction opposite to said first direction.

12. An electrical connector according to claim 1, wherein:
said tapered contact portion of said contact element comprises a compliant bifurcated cone.

13. An electrical connector according to claim 1, wherein:
said tapered contact portion of said contact element comprises one of a cone, a tetrahedron, a sphere, and a four edged pyramid.

14. An electrical connector according to claim 1, further comprising:
retracting means for engaging at least one of said middle portions of said spring contact elements and for releasably holding said at least one middle portion in a position where said tapered contact portion is drawn back toward said dielectric housing.

15. An electrical connector according to claim 1 in conjunction with said second board wherein:
said second board comprises a compliant layer laminated atop a standard printed circuit board, said conductive rims of said second board having contact-quality plating thereon.

16. An electrical connector according to claim 1 in conjunction with an engagement means, wherein:
said engagement means comprises means for maintaining force on said electrical connector to keep said plurality of spring contact elements engaged with said conductive rims of said holes of said second board.

17. An electrical connector in conjunction with an engagement means according to claim 16, wherein:
said engagement means comprises first means abutting said electrical connector, second means attached to said second board, and fastening means engaging said first and second means for drawing said first and second means toward each other.

18. An electrical connector for providing a semi-permanent electrical connection between a first board and the conductive rims of holes of a second board, comprising:
a) a plurality of spring contact element means, at least two of said spring contact element means being electrically isolated one from the other, each spring contact element means having a first portion for electrically contacting said first board, and a second portion including a tapered contact portion for mating with a conductive rim of said holes of said second board, each said spring contact element means being laterally tolerant for permitting said tapered contact portion to move laterally in a substantially free-floating manner so as to seat in said conductive rim of said hole of said second board; and
b) a dielectric housing for housing said plurality of spring contact elements, said dielectric housing comprising a front wall which is substantially parallel said second board when said electrical connector mates with said second board, said front wall having a plurality of apertures for permitting at least a portion of said tapered contact portion of said spring contact element means to extend therethrough,
wherein the axial mating insertion force required to mate said plurality of spring contact element means with said conductive rims is related to the normal contact force generated when said plurality of spring contact element means mate with said conductive rims, and wherein said normal contact force is greater than said mating insertion force.

19. An electrical connector according to claim 18, wherein:
said normal contact force is related to said mating insertion force substantially according to the relationship $F_N = F_A/\sin\theta$, where $F_N$ is said normal contact force, $F_A$ is said mating insertion force, and $\theta$ is the taper angle of said tapered contact portion of said spring contact element means.

20. An electrical connector according to claim 19, wherein:
said dielectric housing comprises a plurality of side walls substantially perpendicular to said front wall for separating columns of said plurality of spring contact elements means.

21. An electrical connector according to claim 20, wherein:
said dielectric housing comprises a plurality of guide walls each said guide wall substantially perpendicular to said front wall and said side walls and substantially parallel and adjacent to said second portion of one of said spring contact element means, said guide walls for separating rows of said plurality of spring contact element means.

22. An electrical connector according to claim 18, wherein:
said second portion of said spring contact element means includes a shaped portion, and said apertures in said front wall are shaped for causing said shaped portion to contact said aperture to stop said spring contact element means in a desired location such that said spring contact element means are preloaded.

23. An electrical connector according to claim 21, wherein:
said second portion of said spring contact element means includes a shaped portion, and said apertures in said front wall are shaped for causing said shaped portion to contact said aperture to stop said spring contact element means in a desired location such that said spring contact element means are preloaded, and
said guide walls and said side walls form passages for said spring contact means, wherein each said passage is arranged to permit a said spring contact element means located therein to move laterally when said spring contact element means contacts said conductive rim.

24. An electrical connector according to claim 23, wherein said plurality of spring contact element means are arranged in at least two rows, further comprising:
locking means for holding said first portions of said spring contact element means of a first row at different fixing points than the spring contact element means of a second row such that said spring contact element means of said first row and second row have substantially identical spring parameters.

25. An electrical connector according to claim 18, wherein:
said tapered contact portion of said contact element is subdivided and compliant.

26. An electrical connector according to claim 18 in conjunction with said second board wherein:
said second board comprises a compliant layer laminated atop a standard printed circuit board, said conductive rims of said second circuit board having contact-quality plating thereon.

27. An electrical connector according to claim 18, wherein:
said tapered contact portion is horizontally resilient.

28. An electrical connector for mating with conductive rims of substantially cylindrical holes of a circuit board, comprising:
 a) a plurality of contact element means, each contact element means having a first portion for making electrical contact with conductor means other than said circuit board, and each contact element means having a tapered contact second portion which mates with one of said conductive rims of said circuit board adjacent said electrical connector, wherein each said contact element means is laterally tolerant for permitting said tapered contact second portion to move laterally in a substantially free-floating manner so as to seat in said conductive rim of said hole of said circuit board; and
 b) fastening means for fastening said electrical connector to said circuit board to keep said plurality of tapered contact element seated in and mated with said conductive rims; and
 c) a dielectric housing for housing said plurality of tapered contact elements.

29. An electrical connector according to claim 28, wherein:
said plurality of tapered contact elements are spring contact elements.

30. An electrical connector according to claim 29, wherein:
said conductive rims are rims of plated through holes in said circuit board.

31. An electrical connector according to claim 30, wherein:
the axial mating insertion force required to mate said plurality of tapered contact element means with said conductive rims is related to normal contact forces generated when said plurality of contact element means mate with said rims, and said normal contact forces are greater than said mating insertion force.

32. An electrical connector according to claim 28, wherein:
said tapered contact second portion is horizontally resilient.

33. An electrical connector for mating with conductive rims of holes of a circuit board, comprising:
 a) a plurality of contact element means, each contact element means having a spring portion which makes electrical contact with conductor means other than said circuit board, and each contact element means having a tapered contact portion coupled to said spring portion for mating with one of said conductive rims of said circuit board, each contact element being laterally tolerant for permitting said tapered contact portion to move laterally in a substantially free-floating manner so as to seat in the conductive rim of the hole in the object with which it mates;
 b) fastening means for use in fastening said electrical connector to said board to keep said plurality of tapered contact elements mated with said conductive rims; and
 c) a dielectric housing for housing said plurality of tapered contact elements.

* * * * *